(12) United States Patent
Venkatraman et al.

(10) Patent No.: US 7,538,370 B2
(45) Date of Patent: May 26, 2009

(54) SEMICONDUCTOR DEVICE HAVING REDUCED GATE CHARGE AND REDUCED ON RESISTANCE AND METHOD

(75) Inventors: Prasad Venkatraman, Gilbert, AZ (US); Irene S. Wan, Phoenix, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 11/624,560

(22) Filed: Jan. 18, 2007

(65) Prior Publication Data

US 2007/0117305 A1      May 24, 2007

Related U.S. Application Data

(62) Division of application No. 10/741,330, filed on Dec. 22, 2003, now Pat. No. 7,189,608.

(51) Int. Cl.
   *H01L 29/80* (2006.01)

(52) U.S. Cl. .................. 257/272; 257/134; 257/256; 257/287

(58) Field of Classification Search ........... 257/272, 257/256, 134–135, 287, 504
See application file for complete search history.

(56) References Cited

U.S. PATENT DOCUMENTS 4,901,132 A *  2/1990  Kuwano .................. 257/134
5,631,484 A *  5/1997  Tsoi et al. ............... 257/341

* cited by examiner

*Primary Examiner*—Chuong A. Luu
(74) *Attorney, Agent, or Firm*—Kevin B. Jackson

(57) ABSTRACT

In one embodiment, a semiconductor device comprises a semiconductor material having a first conductivity type with a body region of a second conductivity type disposed in the semiconductor material. The body region is adjacent a JFET region. A source region of the first conductivity type is disposed in the body region. A gate layer is disposed over the semiconductor material and has a first opening over the JFET region and a second opening over the body region.

17 Claims, 4 Drawing Sheets

SEMICONDUCTOR DEVICE HAVING REDUCED GATE CHARGE AND REDUCED ON RESISTANCE AND METHOD

This application is a divisional of U.S. Ser. No. 10/741,330 filed on Dec. 22, 2003, now U.S. Pat. No. 7,189,608.

BACKGROUND OF THE INVENTION

This invention relates generally to semiconductor devices, and more specifically to a semiconductor device having reduced on resistance and gate charge as well as its method of manufacture.

There is a need for a more efficient power semiconductor device, in particular power metal-oxide-silicon field effect transistor (MOSFET) devices for high frequency applications. It would be desirable to have a power device with low on resistance, a low gate charge and fast switching capabilities.

In high frequency applications, a power device having a low gate charge is desired in order to limit switching losses that lower overall system efficiency. In addition, when the power device is used in low side applications such as in the low side of a buck converter, a low ratio of gate-drain charge to gate-source charge below threshold voltage (i.e., Qgd/Qgsth) is desirable to prevent false turn on or shoot-through current, which also lowers the efficiency of the system. In order to achieve a low Qgd/Qgs(th), it is desirable to manufacture a power device that has low gate to drain capacitance.

Planar vertical power devices manufactured in the past have not been able to achieve low on resistance and low gate charge because changes in the design to lower on resistance detrimentally affect other performance parameters. The tradeoffs of these performance characteristics become a device designer's dilemma that cannot be easily resolved with the conventional planar MOSFET structures used in the past.

Power devices can be manufactured using a trench structure instead of a planar structure. Trench MOSFET designs do obtain lower on resistance. However, trench MOSFETs available today have a high gate charge and thus are not ideal for use in high frequency applications.

Accordingly, a need exists for a device structure that provides for low on resistance and low gate charge for use in high frequency applications. In addition, it would be advantageous for such a device to be fabricated in a cost effective manner.

Figure 1:
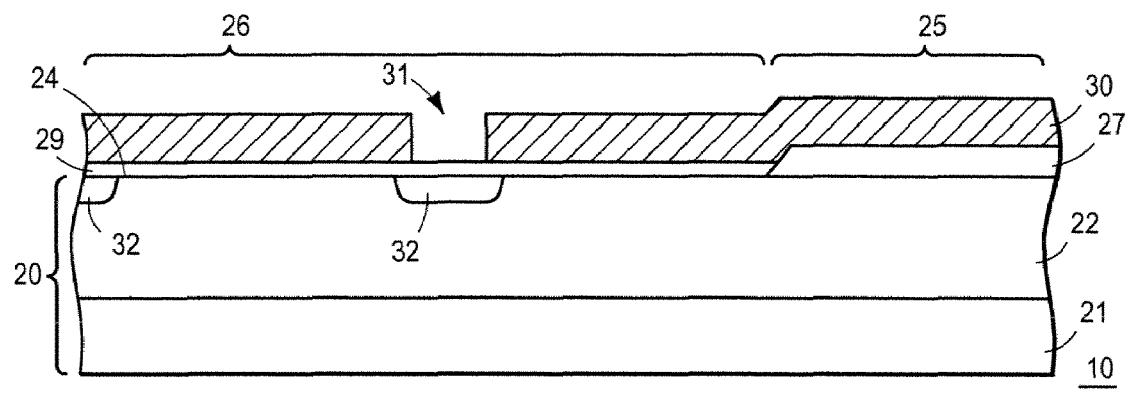
FIG. 1 illustrates a cross-sectional view of a portion of a device in a beginning stage of fabrication in accordance with the present invention.

For simplicity and clarity of illustration, the various figures illustrate the general manner of construction. Descriptions and details of well-known features and techniques are omitted to avoid unnecessarily obscuring the invention. Additionally, the same reference numerals in different figures denote the same elements, and the elements in the drawing figures are not necessarily drawn to scale.

DETAILED DESCRIPTION OF A PREFERRED EMBODIMENT

In general, the present invention pertains to a semiconductor device structure and its method of fabrication, wherein the device structure has low on resistance and low gate charge for use in high frequency applications. More particularly, the present invention pertains to vertical, power semiconductor devices and a method of manufacturing such. The advantages of the present invention can be achieved by providing a split gate structure. The split gate structure has an opening in the gate layer over the JFET region of the device. This opening in the gate layer provides for reduced gate-to-drain capacitance.

The present invention is better understood by referring to FIGS. 1-10 together with the following detailed description. For ease of understanding, only a portion of the device is illustrated to better focus on the novel features of the invention. Although the device according to the present invention is illustrated with specific conductivity types for an n-channel device, the conductivity types may be reversed to provide a p-channel device. In addition, the device of the present invention will be illustrated to show either a cellular design (where the body regions are a plurality of cellular regions) or a single body design (where the body region is comprised of a single region formed in an elongated pattern, typically in a serpentine pattern). However, the device of the present invention will be described as a single base design throughout the description for ease of understanding. It should be understood that it is intended that the present invention encompass both a cellular design and a single base design.

FIG. 1 illustrates an enlarged, cross-sectional view of a portion of semiconductor device 10 in accordance with the present invention. In this embodiment, device 10 is a vertical power MOSFET. Device 10 includes a body of semiconductor material 20, preferably including a semiconductor substrate 21 of a first conductivity type and an epitaxial semiconductor layer 22, also of the first conductivity type, disposed on semiconductor substrate 21. Semiconductor material 20 includes a first major surface 24. For an n-channel device, semiconductor substrate 21 and semiconductor layer 22 comprises an n-type material. The resistivity of semiconductor substrate 21 is preferably in the range of approximately 0.001 to 0.005 ohm-cm and may be doped with arsenic. The resistivity of semiconductor layer 22 depends on the desired voltage rating of device 10, and is for example, in the range of approximately 0.15 to 0.50 ohm-cm. Semiconductor layer 22 may be doped with phosphorus. The thickness of semiconductor layer 22 depends on the desired voltage rating of device 10, but may be in the range of approximately 2.5 to 5.0 microns.

FIG. 1 also shows the formation of a field dielectric layer 27 on first major surface 24. Field dielectric layer 27 is shown already patterned using conventional photolithography and etch techniques to leave a portion of field dielectric layer 27 in a field region 25 of device 10 and to remove a portion of field dielectric layer 27 in an active area 26 of device 10. Preferably, field dielectric layer 27 is comprised of silicon dioxide and is formed by thermal oxidation at a temperature in the range of approximately 900 to 1000 degrees Celsius (° C.), and having a thickness of about 3,000 to 6,000 Angstroms.

Next, a gate dielectric layer 29 is formed over first major surface 24 of semtconductor material 20 and field oxide layer 27. Gate dielectric layer 29 is preferably comprised of silicon dioxide having a thickness of approximately 100 to 800 Angstroms. Because gate dielectric layer 29 is comprised of the same material as field dielectric layer 27, gate dielectric layer 29 is not separately shown under field dielectric layer 27 for illustrative convenience Still with reference to FIG. 1, a gate layer 30 is formed over semiconductor material 20. Gate layer 30 is preferably comprised of a refractory metal, a refractory metal suicide, or polycrystalline silicon (e.g., polysilicon) and is deposited having a thickness in the range of approximately 3000 to 6000 Angstroms. In a preferred embodiment, gate layer 30 comprises tungsten or tungsten suicide. when gate layer 30 comprises a polycrystalline silicon layer, gate layer 30 is of the first conductivity type and may be formed by implanting phosphorus with a dose of approximately $2.0 \times 10^{15}$ to $1.0 \times 10^{16}$ atoms/cm$^2$ at an implant energy of approximately 40 keV.

Next, an opening or a plurality of openings 31 is formed in gate layer 30. Opening 31 is formed using conventional photolithography and etch steps. In semiconductor devices of the past, opening 31 is not formed. As will be explained in greater detail below, opening 31 is what provides for a reduced gate-to-drain capacitance, which in turn provides for a lower gate charge.

Optionally, a JFET dopant region 32 of the first conductivity type may be formed in semiconductor layer 22 extending from first major surface 24 into a portion of semiconductor layer 22 to a depth of approximately 0.5 to 1.5 microns. JFET dopant region 32 lowers the on resistance of device 10. The region in which JFET dopant region 32 is implanted comprises a JFET region or a drain region portion 41 (shown in FIG. 3) of device 10. JFET dopant region 32 preferably has a dopant concentration of approximately $1.0 \times 10^{16}$ to $1.0 \times 10^{17}$ atoms/cm$^3$ and may be formed by implanting phosphorus with a dose in the range of approximately $3.0 \times 10^{11}$ to $3.0 \times 10^{12}$ atoms/cm$^2$ at approximately 60 to 80 keV.

Figure 2:
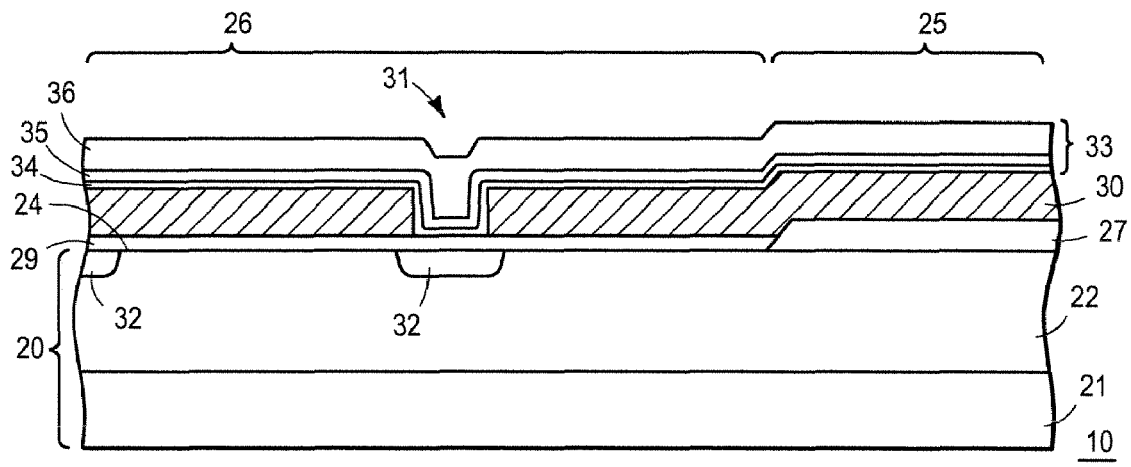
FIG. 2 illustrates a cross-sectional view of the device of FIG. 1 further along in processing in accordance with the present invention.

Turning now to FIG. 2, an interlevel or interlayer dielectric (ILD) layer 33 is formed over semiconductor material 20. ILD layer 33 is preferably comprised of a deposited oxide (e.g., a TEOS oxide) about 3,000 to 6,000 Angstroms thick. Alternatively, ILD layer 33 comprises first silicon oxide layer 34, a silicon nitride layer 35, and a second silicon oxide layer 36. First silicon oxide layer 34 preferably has a thickness in the range of approximately 200 to 600 Angstroms. Silicon nitride layer 35 preferably has a thickness in the range of approximately 500 to 1,500 Angstroms and is deposited using conventional methods. Second silicon oxide layer 36 is preferably comprised of a deposited oxide (e.g., a TEOS oxide) and deposited having a thickness in the range of approximately 3,000 to 6,000 Angstroms. The portion of ILD layer 33 that fills opening 31 replaces the material of gate layer 30 of devices made in the past.

Figure 3:
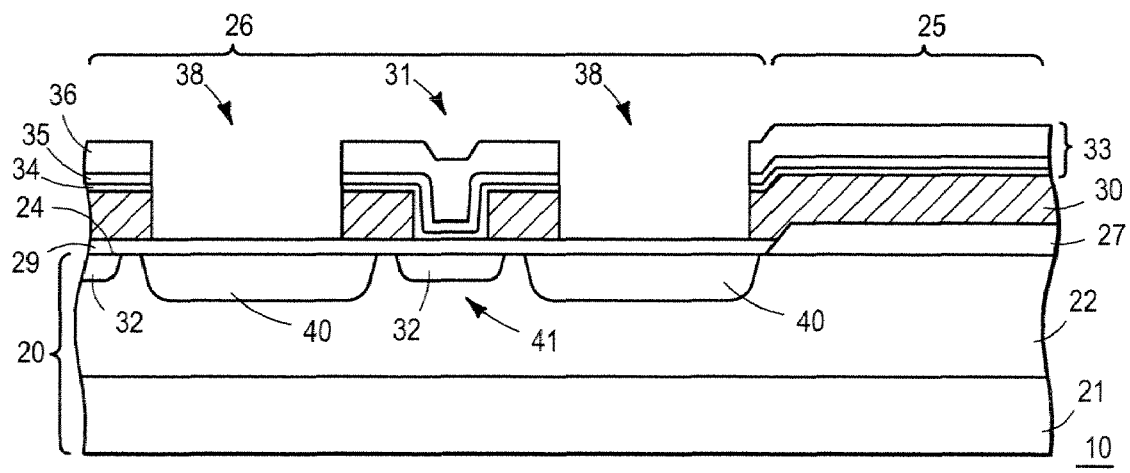
FIG. 3 illustrates a cross-sectional view of the device of FIG. 2 further along in processing in accordance with the present invention.

Now with reference to FIG. 3, a photolithography and etch step is performed to form an opening 38 in ILD layer 33 and gate layer 30 in the active area 26 of device 10. Next, a body region 40 is formed in semiconductor layer 22 through opening 38. Body region 40 is of a second conductivity type and is preferably formed by implanting boron with a dose of approximately $1.5 \times 10^{13}$ to $6.0 \times 10^{13}$ atoms/cm$^2$ with an energy of approximately 40 keV and subsequently exposing device 10 to a thermal cycle so that body region 40 extends into semiconductor layer 22 approximately 1.0 to 3.0 microns from first major surface 24. In the embodiment described herein, opening 38 is a single, continuous opening, and body region 40 is a single, continuous region and what is shown is the cross-section showing several fingers of a serpentine pattern. Alternatively, body region 40 may be formed as a plurality of body regions.

Still with reference to FIG. 3, the region between adjacent portions of body region 40 defines JFET or drain region portion 41 of device 10. It is preferable that opening 31 does not extend into body regions 40, in order to prevent the threshold voltage from becoming too high. However, to minimize the gate to drain overlap capacitance, it is preferred that opening 31 extends to about the edge of body region 40 or is disposed over substantially all of JFET region 41. Preferably, opening 31 is disposed over about 30% to about 100% of JFET region 41. Opening 31 in gate layer 30 provides for a reduced overlap between gate layer 30 and JFET region 41, which results in forming device 10 having a reduced gate-to-drain capacitance.

Optionally, to further reduce the on resistance of device 10, a high tilt angle implant may be performed to form body region 40. Preferably, the angled implant is done with rotation. By using the angled implant, a heavier and more precisely controlled dopant concentration near first major surface 24 can be achieved. In a preferred embodiment, the tilt angle is between 20 to 60 degrees. In a more preferred embodiment, the tilt angle is between 35 to 60 degrees. When preferred rotation is used, device 10 is implanted, for example, four times with a 90 degree rotation between each implant. In addition, a reduced thermal cycle may be implemented to further reduce the depth of body region 40 to approximately 0.6 to 1.0 microns. In a preferred embodiment, the reduced thermal cycle is a temperature of 800 to 1000° C. for approximately 60 to 90 minutes. A shallower depth of body region 40 results in further reducing the on resistance of device 10.

Figure 4:
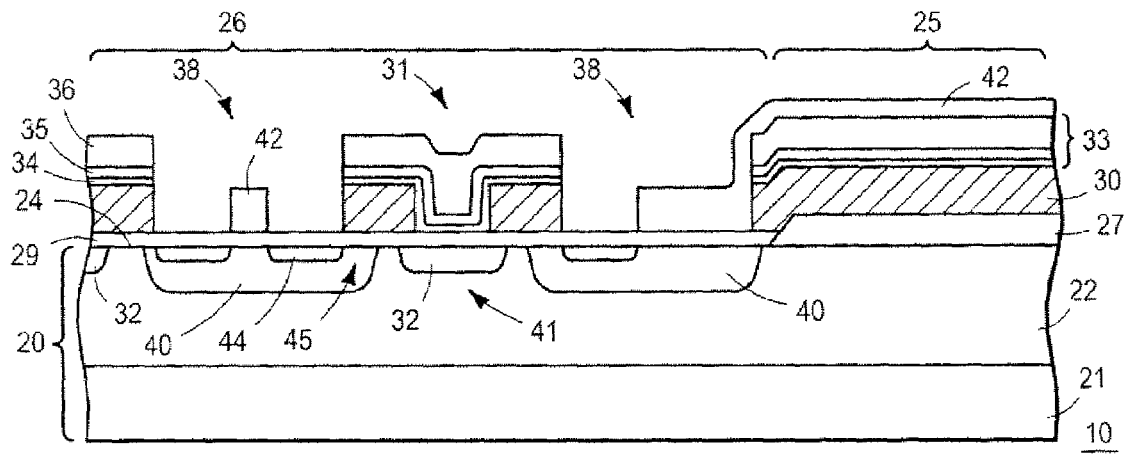
FIG. 4 illustrates a cross-sectional view of the device of FIG. 3 further along in processing in accordance with the present invention.

Turning now to FIG. 4, a photoresist layer 42 is formed over semiconductor material 20 and patterned to leave blocking portions in opening 38 and over ILD layer 33 in field region 25. A source region 44 is then formed in semiconductor layer 22 in body region 40 and extending to a depth of approximately 0.2 to 0.5 microns from first major surface 24. Source region 44 is of the first conductivity type. The portions of photoresist layer 42 block the source implant into a portion of body regions 40. Note that only a portion of source region 44 is formed in body region 40 adjacent to field region 25 such that this portion of device 10 only forms one-half of an active cell of device 10. A channel length 45 is defined by an edge of body region 40 and an edge of source region 44 underneath gate layer 30. If the body region 40 is fabricated to be shallower, then a shorter channel length 45 can be achieved. Source region 44 may be formed by implanting arsenic with a dose in the range of approximately $3.0 \times 10^{15}$ to $1.0 \times 10^{16}$ atoms/cm$^2$ at approximately 80 keV. In a single base design, source region 44 has an elongated shape. In a cellular design, source region 44 has an elongated ring shape (the cross section shown is taken in the middle of the ring).

Figure 5:
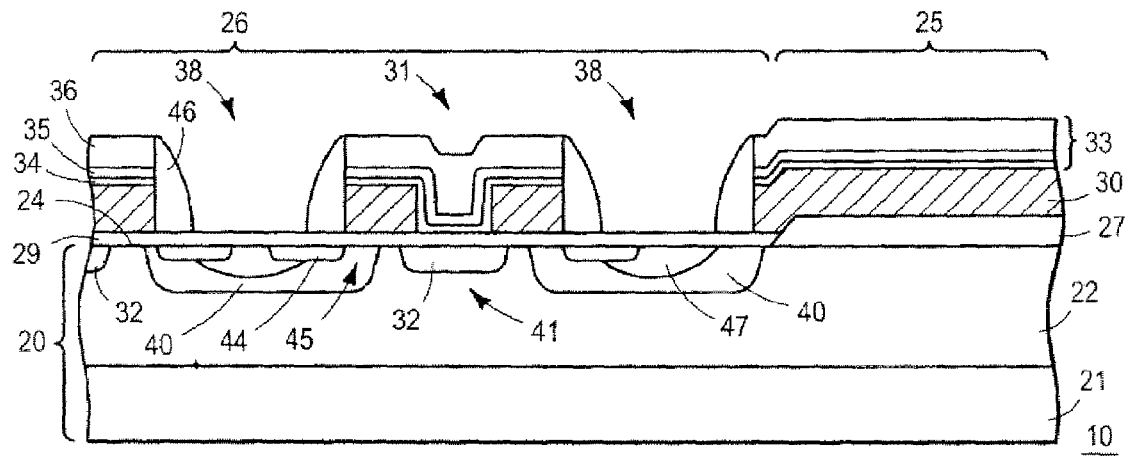
FIG. 5 illustrates a cross-sectional view of the device of FIG. 4 further along in processing in accordance with the present invention.

Now turning to FIG. 5, spacers 46 are formed on the sidewalls of opening 38 adjacent ILD layer 33. Spacers 46 may be formed by depositing TEOS at a thickness in the range of approximately 3,000 to 6,000 Angstroms and then dry etching in active area 26 to leave spacers 46. A contact region 47 of the second conductivity type is then formed through opening 38 using spacers 46 as a mask. Contact region 47 comprises either a plurality of regions or a single elongated region. Contact region 47 is formed in order to provide a lower contact resistance to body region 40 at first major surface 24. In addition, contact region 47 also lowers the sheet resistance of body region 40 under source region 44, which improves the energy handling capability of device 10. Preferably, contact region 47 is formed by implanting boron with a dose of approximately $5.0 \times 10^{14}$ to $5.0 \times 10^{15}$ atoms/cm$^2$ at approximately 40 keV. If device 10 was fabricated having a cellular design (with a plurality of spaced apart individual body regions), device 10 would comprise a plurality of openings 38, body regions 40, source regions 44 (each ring shaped), contact regions 47, and spacers 46.

Figure 6:
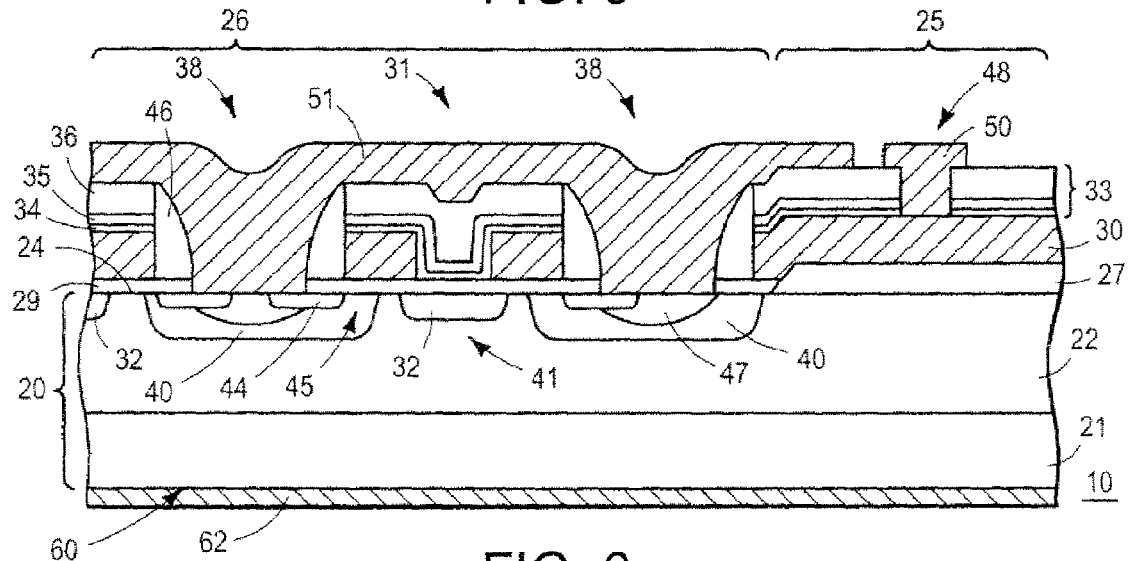
FIG. 6 illustrates a cross-sectional view of the device of FIG. 5 further along in processing in accordance with the present invention.

Turning now to FIG. 6, an opening 48 is made in ILD layer 33 in field region 25 using conventional photolithography and etch steps, which provides a contact region to gate layer 30. Next, a metal layer is deposited and patterned using standard photolithography and etch steps to form a gate metal layer 50 and a source metal layer 51. For the drain contact, a back grind is performed on semiconductor material 20, specifically to reduce the thickness of substrate layer 21. A drain metal layer 62 is then deposited on a second major surface 60 of semiconductor material 20. Gate metal layer 50 and source metal layer 51 are preferably comprised of a titanium, titanium nitride, and aluminum silicon copper. Gate metal layer 50 is electrically coupled to gate layer 30. Source metal layer 51 is electrically coupled to source regions 44 and contact regions 47. Drain metal layer 62 is preferably comprised of titanium, nickel and silver.

Figure 7:
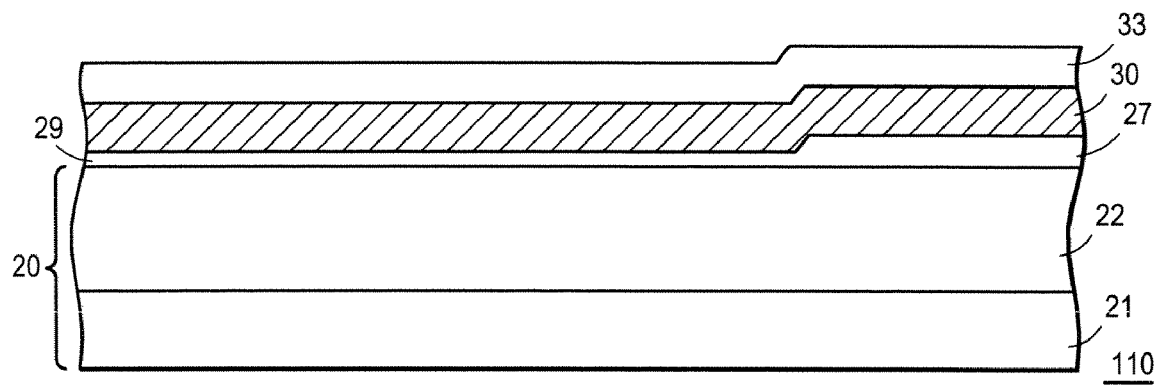
FIG. 7 illustrates a cross-sectional view of a portion of an alternative embodiment of a device in a beginning stage of fabrication in accordance with the present invention.
Figure 8:
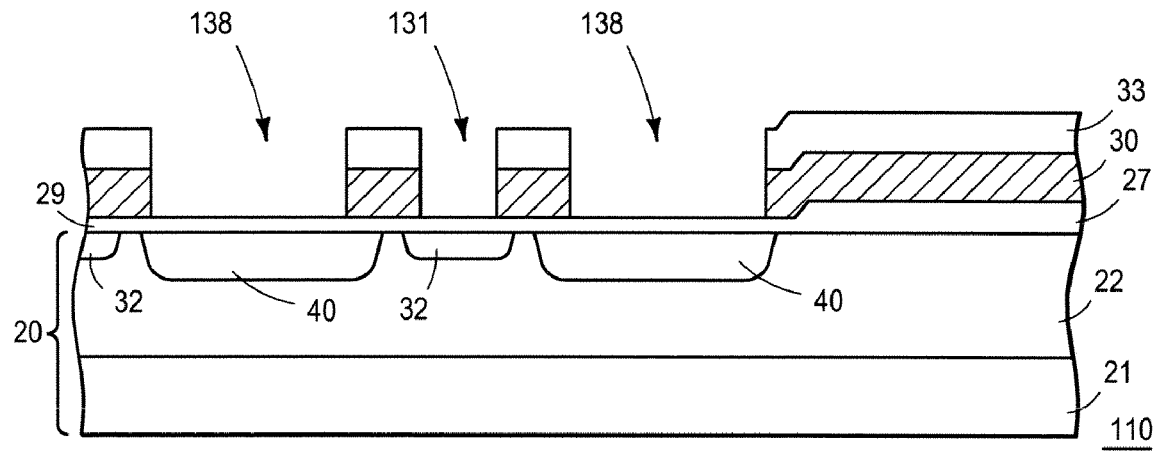
FIG. 8 illustrates a cross-sectional view of the device of FIG. 7 further along in processing in accordance with the present invention.

Turning now to FIG. 7, an alternative embodiment of a device 110 according to the present invention is described. Device 110 is similar to device 10 except that ILD layer 33 is deposited over gate layer 30 without forming opening 31. Next as shown in FIG. 8, a photolithographic and etch step is used to form openings 138 and 131 in ILD layer 33 and gate layer 30 at the same time. In this way, openings 131 and 138 are self-aligned, which eliminates any photolithograhic alignment tolerance issues that may exist between openings 31 and 38 of device 10. This enables opening 131 to be larger than opening 31, which reduces gate to drain capacitance further.

Optionally, JFET dopant region 32 is then formed through opening 131. Opening 138 is either masked or unmasked during the formation of JFET dopant region 32. A masking layer (not shown) is then formed over opening 131 during the formation of body region 40 (described in conjunction with FIG. 3). The masking layer is then removed, and processing continues as described in conjunction with FIG. 4.

Figure 9:
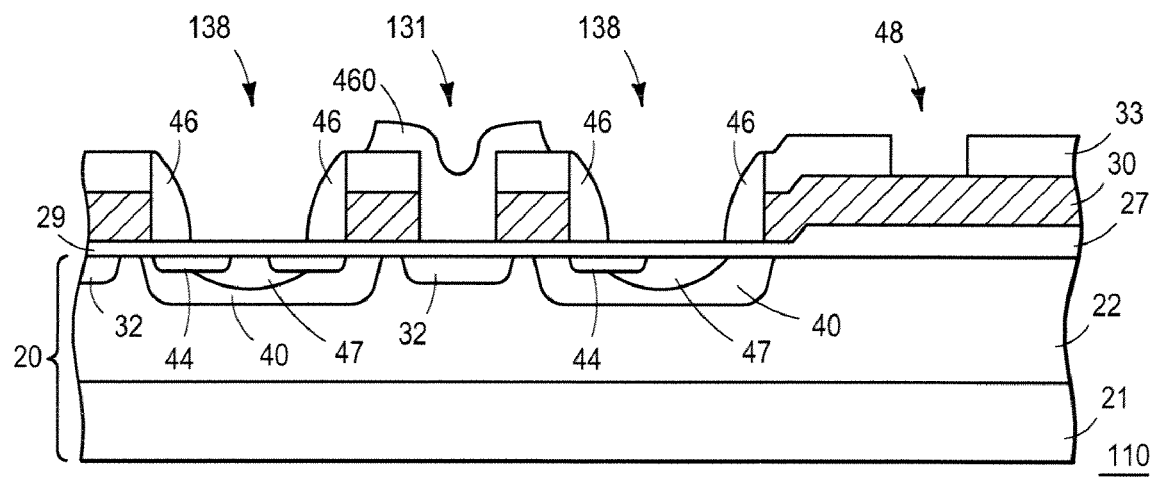
FIG. 9 illustrates a cross-sectional view of the device of FIG. 8 further along in processing in accordance with the present invention.
Figure 10:
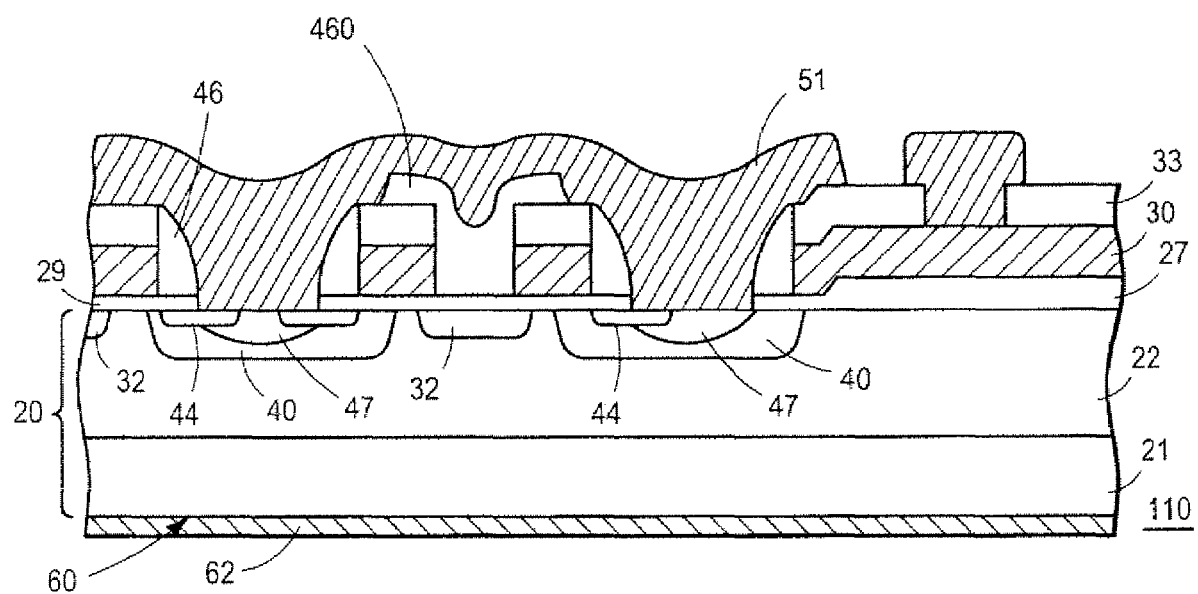
FIG. 10 illustrates a cross-sectional view of the device of FIG. 9 further along in processing in accordance with the present invention.

FIG. 9 shows device 110 at a later step of fabrication after a spacer dielectric layer (not shown) is deposited over device 110. The spacer dielectric layer preferably comprises a deposited oxide (e.g., TEOS), and has thickness in the range of approximately 3,000 to 6,000 Angstroms. Prior to etching back the spacer dielectric layer, a masking layer (not shown) is formed and patterned over opening 131 so that dielectric layer or region 460 remains after the etch back step to form spacer 46. Device 110 is further processed as described in conjunction with FIGS. 5 and 6 to provide the structure shown in FIG. 10.

Thus, devices 10 and 110 of the present invention have a reduced gate charge provided by opening 31 or opening 131 in gate layer 30. Optionally, lower on resistance can be achieved by providing first doped region 32 in JFET region 41. With or without first doped region 32, device 10 is suitable for use in high frequency and fast switching applications. If more enhanced performance is desirable, body regions 40 can be formed with an angled implant to achieve an even further reduction in on resistance. Moreover, the process of forming device 10 readily integrates into existing methods of forming power devices, and thus the process of the present invention is very cost effective.

Thus it is apparent that there has been provided, in accordance with the present invention, a device having a low gate charge by providing a split gate layer or openings in the gate layer over the JFET region of the device.

Although the invention has been described and illustrated with reference to specific embodiments thereof, it is not intended that the invention be limited to these illustrative embodiments. Those skilled in the art will recognize that modifications and variations can be made without departing from the spirit of the invention.

Furthermore, the terms first, second, third and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in other sequences than described or illustrated herein.

Moreover, the terms top, bottom, over, under, and the like in the description and in the claims, if any, are used for descriptive purposes and not necessarily for describing relative positions. It is understood that the terms so used are interchangeable under appropriate circumstances and that the embodiments of the invention described herein are capable of operation in other orientations than described or illustrated herein.

Therefore, it is intended that this invention encompass all such variations and modifications as fall within the scope of the appended claims.

We claim:

1. A semiconductor device comprising:
   a semiconductor material having a first conductivity type and a first major surface;
   first and second body regions of a second conductivity type disposed in the semiconductor material, wherein the first and second body regions are separated by a JFET region of the first conductivity type;
   a first source region of the first conductivity type disposed in the first body region;
   a gate layer comprising a conductive material disposed overlying the first major surface of the semiconductor material having a first opening over the JFET region and a second opening over the first body region, wherein the first opening is configured for reducing gate to drain capacitance; and
   an interlevel dielectric layer disposed in the first opening over the semiconductor material.

2. The semiconductor device of claim 1 further comprising:
   a first doped region of the first conductivity type disposed in the semiconductor material in the JFET region, wherein the first doped region has a higher doping concentration than the semiconductor material.

3. The semiconductor device of claim 2 wherein the first doped region has a dopant concentration of approximately $1.0 \times 10^{16}$ to $1.0 \times 10^{17}$ atoms/cm$^3$.

4. The semiconductor device of claim 1 wherein the inter-level dielectric is comprised of silicon oxide.

5. The semiconductor device of claim 1, wherein the gate layer is comprised of a refractory metal silicide.

6. The semiconductor device of claim 1, wherein the semiconductor device comprises a vertical power MOSFET.

7. The semiconductor device of claim 1, wherein the first opening is disposed over substantially all of the JFET region.

8. The semiconductor device of claim 1, wherein the first opening is disposed over about 30 to 100 percent of the JFET region.

9. A vertical semiconductor device comprising:
a semiconductor material having a first conductivity type and a first major surface;
first and second body regions of a second conductivity type opposite the first conductivity type formed in the semiconductor material extending from the first major surface of the semiconductor material into a portion of semiconductor material, wherein a JFET region of the first conductivity type separates the first body region from the second body region;
a source region of first conductivity type formed in the first body region;
a gate dielectric layer overlying the JFET region and at least portions of the first and second body regions;
a gate layer comprising a conductive material formed overlying gate dielectric layer;
a first dielectric layer formed overlying the gate layer;
a first opening formed in the first dielectric layer and the gate layer over the JFET region;
a second opening formed in the first dielectric layer and the gate layer overlying the first body region; and
a second dielectric layer formed within the first opening for reducing gate to drain capacitance.

10. The device of claim 9, wherein the second dielectric layer comprises a deposited oxide layer.

11. The device of claim 9, wherein the second dielectric layer has a thickness from about 3,000 Angstroms to about 6,000 Angstroms.

12. The device of claim 9 further comprising a third dielectric overlying the second dielectric layer within the first opening.

13. The device of claim 12, wherein the second dielectric layer comprises an oxide layer, and wherein the third dielectric layer comprises a nitride layer.

14. A vertical MOSFET device comprising:
a semiconductor material having a first conductivity type and a first major surface;
first and second body regions of a second conductivity type opposite the first conductivity type formed in the semiconductor material extending from the first major surface of the semiconductor material into a portion of semiconductor material, wherein the first and second body regions are spaced apart with a JFET region there between;
a first source region of the first conductivity type formed in the first body region;
a second source region of the first conductivity type formed in the second body region;
a conductive gate layer formed overlying the first major surface of the semiconductor material having a first opening overlying the JFET region configured to reduce gate charge, a second opening over the first body region, and a third opening over the second body region; and
a dielectric layer formed within the first opening.

15. The device of claim 14 further comprising a doped region of the first conductivity type formed in the JFET region, wherein the doped region has a higher doping concentration than the semiconductor material and is configured to reduce on-resistance.

16. The device of claim 14, wherein the first and second body regions comprise a single body.

17. The device of claim 14, wherein the first and second body regions comprise a cellular design.

* * * * *